United States Patent
Lee

(10) Patent No.: US 12,244,954 B2
(45) Date of Patent: Mar. 4, 2025

(54) SEMICONDUCTOR DEVICE

(71) Applicant: Samsung Electronics Co., Ltd., Suwon-si (KR)

(72) Inventor: Hyeokjong Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 285 days.

(21) Appl. No.: 18/057,252

(22) Filed: Nov. 21, 2022

(65) Prior Publication Data
US 2023/0171523 A1    Jun. 1, 2023

(30) Foreign Application Priority Data

Nov. 26, 2021   (KR) .................. 10-2021-0165731
Jun. 13, 2022   (KR) .................. 10-2022-0071735

(51) Int. Cl.
  *H04N 25/78* (2023.01)
  *H01L 27/146* (2006.01)
  *H04N 25/616* (2023.01)
  *H04N 25/771* (2023.01)

(52) U.S. Cl.
  CPC ....... *H04N 25/78* (2023.01); *H01L 27/14643* (2013.01); *H04N 25/616* (2023.01); *H04N 25/771* (2023.01)

(58) Field of Classification Search
  CPC .... H04N 25/616; H04N 25/771; H04N 25/78; H01L 27/14643; H03K 21/00
  See application file for complete search history.

(56) References Cited

U.S. PATENT DOCUMENTS

| | | | |
|---|---|---|---|
| 8,035,717 B2 | 10/2011 | Hisamatsu | |
| 8,314,868 B2 | 11/2012 | Yamamoto | |
| 8,520,796 B2 | 8/2013 | Koyama | |
| 9,332,202 B2 | 5/2016 | Totsuka | |
| 9,380,246 B2 | 6/2016 | Lee | |
| 9,762,836 B2 | 9/2017 | Kurose | |
| 10,097,196 B2 | 10/2018 | Sato | |
| 2015/0138408 A1* | 5/2015 | Lee | H04N 25/616 |
| | | | 348/294 |
| 2019/0052827 A1* | 2/2019 | Koyama | H04N 25/60 |
| 2019/0098234 A1* | 3/2019 | Lee | H04N 25/65 |
| 2019/0394417 A1 | 12/2019 | Hisamatsu et al. | |

FOREIGN PATENT DOCUMENTS

| | | |
|---|---|---|
| JP | 2010-057019 A | 3/2010 |
| KR | 10-2004-0105454 A | 12/2004 |
| KR | 10-2015-0076065 A | 7/2015 |
| KR | 102104564 B1 | 4/2020 |

OTHER PUBLICATIONS

Extended European Search Report dated Mar. 27, 2023 issued in European Patent Application No. 22210006.7-1208.

* cited by examiner

*Primary Examiner* — Lin Ye
*Assistant Examiner* — Chriss S Yoder, III
(74) *Attorney, Agent, or Firm* — Harness, Dickey & Pierce, P.L.C.

(57) ABSTRACT

Provided is a semiconductor device. The semiconductor device includes a first counter latch circuit configured to receive a count code and to latch the count code according to a comparison result signal; and a second counter latch circuit configured to receive the count code from the first counter latch circuit, and to latch the count code by using a plurality of first latches. The first latches are coupled in series to each other and are configured to operate to sequentially bypass values transmitted to the respective first latches.

20 Claims, 11 Drawing Sheets

SEMICONDUCTOR DEVICE

CROSS-REFERENCE TO RELATED APPLICATION

This application claims priority to and the benefit of Korean Patent Application No. 10-2021-0165731 filed in the Korean Intellectual Property Office on Nov. 26, 2021 and Korean Patent Application No. 10-2022-0071735 filed in the Korean Intellectual Property Office on Jun. 13, 2022, the entire contents of each of which are incorporated herein by reference.

BACKGROUND

Various example embodiments relate to a semiconductor device.

An image sensor captures 2-dimensional (2D) and/or 3D images of objects. The image sensor may generate the images of the object by using a photovoltaic device reacting to intensity of light reflected from the object. As CMOS (Complementary Metal-Oxide Semiconductor) technology develops, CMOS image sensors are widely used. The CMOS image sensors use the correlated double sampling (CDS) method to capture images, and count differences between signals sampled by the CDS method, for example, reset signals and video signals, and output result signals as digital signals.

SUMMARY

Various example embodiments provide a semiconductor device for allowing a high-rate operation and simplifying a layout.

According to some example embodiments, a semiconductor device includes a first counter latch circuit configured to receive a count code and to latch the count code according to a comparison result signal; and a second counter latch circuit configured to receive the count code from the first counter latch circuit, and to latch the count code by using a plurality of first latches. The first latches may be coupled in series to each other and may be configured to operate to sequentially bypass values transmitted to the respective first latches.

The first latches coupled in series to each other may include a first front latch and a first rear latch, and an output signal port of the first front latch may be directly connected to an input signal port of the first rear latch through a signal line.

The semiconductor device may be configured to operate such that the count code may be transmitted to the first latches in an order from a least significant bit to a most significant bit.

The second counter latch circuit may include a plurality of first tri-state inverters configured to selectively transmit the count code output by the respective first latches to another circuit according to a control signal.

The semiconductor device may further include a data latch circuit configured to receive a data code that corresponds to a result of performing an operation on a first count code latched to the first counter latch circuit and a second count code latched to the second counter latch circuit, and to latch the data code by using a plurality of second latches. The second latches may be coupled in series to each other and may be configured to operate to sequentially bypass values transmitted to the respective second latches.

The second latches coupled in series to each other may include a second front latch and a second rear latch, and an output signal port of the second front latch may be directly connected to an input signal port of the second rear latch through a signal line.

The semiconductor device may be configured to transmit the data code to the second latches in an order from a least significant bit to a most significant bit.

The data latch circuit may include a plurality of second tri-state inverters configured to selectively transmit the data code output by the respective second latches to another circuit, the selectively transmitting according to a control signal.

The first counter latch circuit may be configured to latch image component data, the second counter latch circuit may be configured to latch reset component data by using the first latches, and the data latch circuit may be configured to receive valid image data that is a subtraction of the reset component data from the image component data as the data code.

The data latch circuit may be configured to latch the valid image data by using second latches.

According to some example embodiments, a semiconductor device includes a first counter latch circuit configured to receive a count code and to latch the count code according to a comparison result signal; and a second counter latch circuit including a plurality of first latches coupled in series to each other and configured to operate according to an operation mode, the operation mode based on a first control signal, and to receive the count code from the first counter latch circuit. The first latches are configured to operate as latches in response to the first control signal being a first value, and the first latches are configured to operate as buffers in response to the first control signal being a second value that is different from the first value.

The respective first latches may include a plurality of tri-state inverters configured to be controlled according to the first control signal.

The first latches coupled in series to each other may include a first front latch and a first rear latch, and an output signal port of the first front latch may be directly connected to an input signal port of the first rear latch through a signal line.

The count code may be transmitted to the first latches in order from a least significant bit to a most significant bit.

The semiconductor device may further include a data latch circuit including a plurality of second latches coupled in series to each other and configured to operate according to an operation mode controlled based on a second control signal, and to receive a data code that corresponds to a result of performing an operation on a first count code latched to the first counter latch circuit and a latched second count code provided by the second counter latch circuit. The second latches may be configured to operate as latches in response to the second control signal being a third value, and the second latches may be configured to operate as buffers in response to the second control signal being a fourth value that is different from the third value.

The respective second latches may include a plurality of tri-state inverters configured to be controlled according to the second control signal.

The second latches coupled in series to each other may include a second front latch and a second rear latch, and an output signal port of the second front latch may be directly connected to an input signal port of the second rear latch through a signal line.

The semiconductor device may be configured to operate such that the data code is transmitted to the second latches in order from a least significant bit to a most significant bit.

The first counter latch circuit may be configured to latch image component data, the second counter latch circuit may be configured to latch reset component data by using the first latches, and the data latch circuit may be configured to receive valid image data that is a subtraction of the reset component data from the image component data as the data code.

The data latch circuit may be configured to latch the valid image data by using second latches.

DETAILED DESCRIPTION OF VARIOUS EXAMPLE EMBODIMENTS

Figure 1:
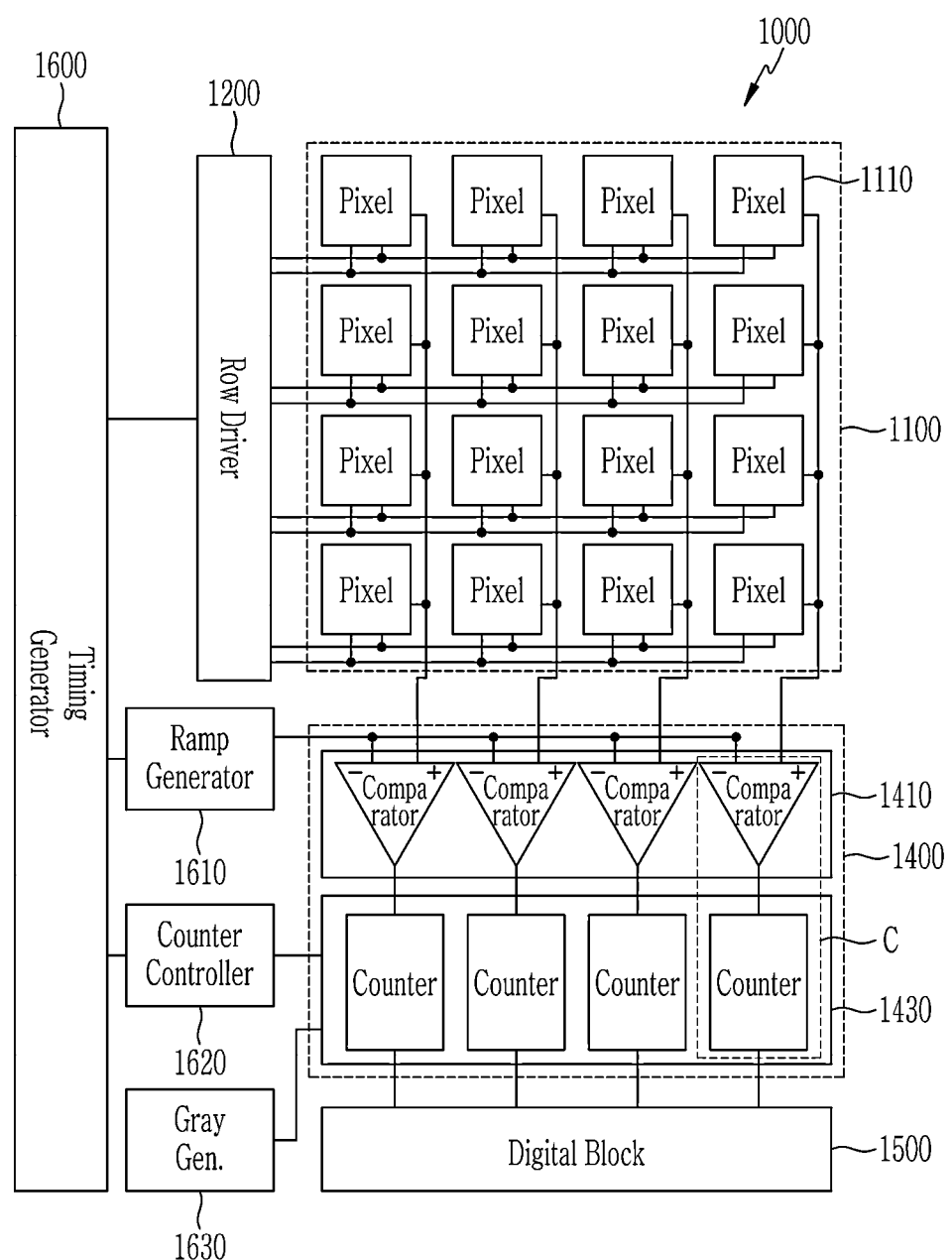
FIG. 1 shows an image sensor according to various example embodiments.

In the following detailed description, only some example embodiments have been shown and described, simply by way of illustration. As those of ordinary skill in the art may realize, the various example embodiments may be modified in various different ways, all without departing from the spirit or scope of inventive concepts.

Accordingly, the drawings and description are to be regarded as illustrative in nature and not restrictive, and like reference numerals designate like elements throughout the specification.

An expression recited in the singular may be construed as singular or plural unless the expression "one", "single", etc., is used. Terms including ordinal numbers such as first, second, and the like, will be used only to describe various components, and are not to be interpreted as limiting these components. The terms may be only used to differentiate one component from others.

Figure 2:
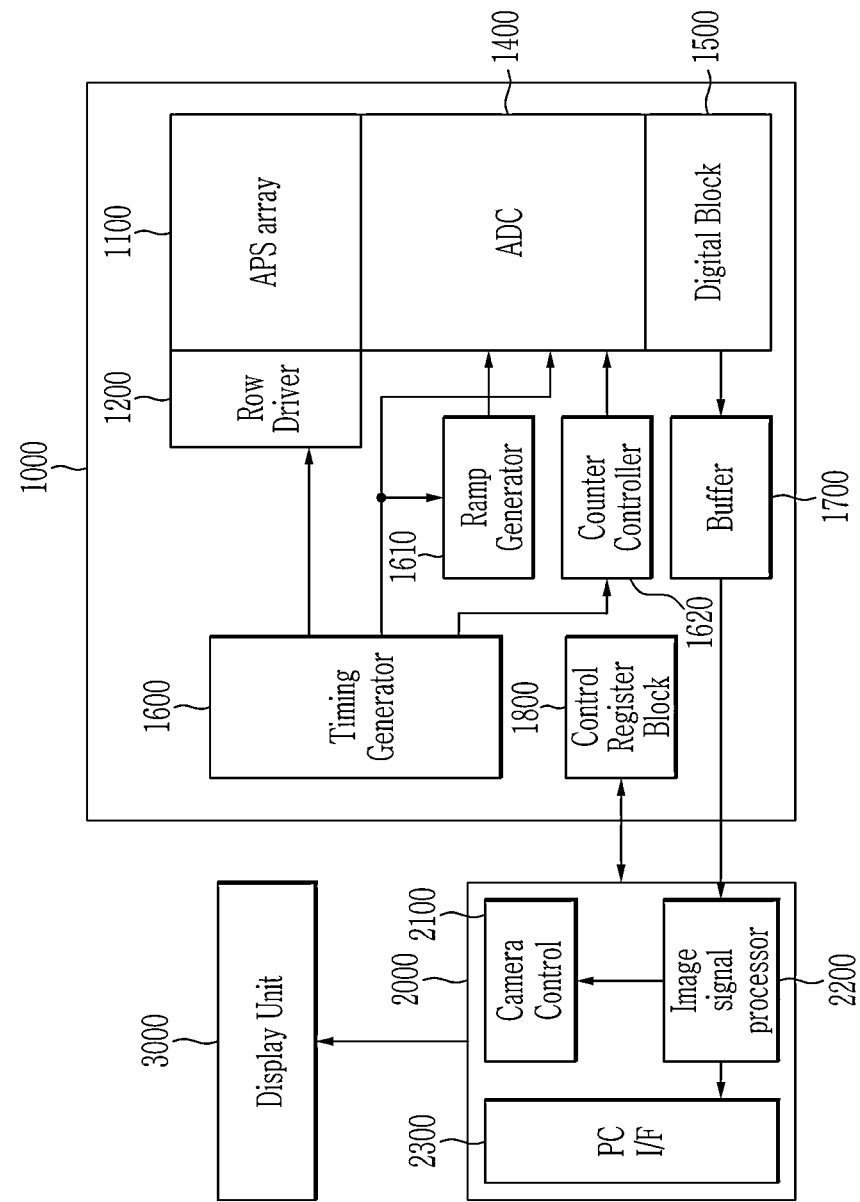
FIG. 2 shows an image processing system according to various example embodiments.

FIG. 1 shows an image sensor according to various example embodiments, and FIG. 2 shows an image processing system according to various example embodiments.

Referring to FIG. 1 and FIG. 2, an image processing system 1 according to various example embodiments may include an image sensor 1000, an image processor 2000, and a display unit 3000.

The image sensor 1000 may include a pixel array 1100, a row driver 1200, an analog-to-digital converter 1400, a digital block 1500, a timing signal generator 1600, a reference signal generator 1610, a counter controller 1620, a gray code generator 1630, a buffer 1700, and a control register block 1800. FIG. 1 and FIG. 2 show the timing signal generator 1600 in a separate way to clearly describe its functions, and the timing signal generator 1600 may be positioned in the digital block 1500. Furthermore any or all of the components illustrated in FIGS. 1 and 2 may be able to communicate with any or all other components illustrated in FIGS. 1 and 2, for example to communicate directly and/or indirectly, over a bus such as a serial bus and/or a parallel bus that is wired and/or wireless, in a one-way and/or two-way and/or multiway (e.g. broadcast way), to exchange information such as but not limited to data and/or commands; example embodiments are not limited thereto.

The image sensor 1000 senses objects captured through a lens according to control by the image processor 2000, and the image processor 2000 may output the images sensed and output by the image sensor 1000 to the display unit 3000. In this instance, the display unit 3000 may include an arbitrary device for displaying images. For example, the display unit 3000 may include one or more of a computer, a smartphone, and other image output terminals (not illustrated).

The image processor 2000 may include a camera control 2100, an image signal processor 2200, and a PC I/F 2300. The camera control 2100 may control the control register block 1800. In this instance, the camera control 2100 may control the image sensor 1000 or the control register block 1800 by using an inter-integrated circuit ($I^2C$), and a range of the present disclosure is not limited thereto.

The image signal processor 2200 may receive image data that is or are output signals of the buffer 1700, may process the image data, and may output resultant data to the display unit 3000 through the PC I/F 2300.

FIG. 2 shows that the image signal processor 2200 is positioned in the image processor 2000, and the image signal processor 2200 may be designed to be positioned outside the image processor 2000. For example, the image signal processor 2200 may be designed to be positioned in the image sensor 1000.

The pixel array 1100 may include a plurality of pixels in a matrix format (e.g. in a rectangular or square format) in which they are connected to a plurality of row lines and a plurality of column lines. The respective pixels may include a red pixel for converting light in a red spectrum region into an electrical signal, a green pixel for converting light in a green spectrum region into an electrical signal, and a blue pixel for converting light in a blue spectrum region into an electrical signal, which may or may not be arranged in a Bayer pattern.

Respective color filter arrays for transmitting light in a specific spectrum region may be arranged on upper portions of a plurality of pixels configuring the pixel array 1100.

The pixel array 1100 may include a plurality of photo-sensing devices, for example, photodiodes and/or pinned photodiodes. The pixel array 1100 senses light by using a plurality of photo-sensing devices, and convert it into electrical signals to generate video signals. This will be described later with reference to FIG. 3.

The timing signal generator 1600 may supply control signals or clock signals to the row driver 1200, the analog-to-digital converter 1400, the reference signal generator 1610, and the counter controller 1620 to control operations or timing of the row driver 1200, the analog-to-digital converter 1400, the reference signal generator 1610, and the counter controller 1620, and the control register block 1800 may supply control signals to the reference signal generator 1610, the timing signal generator 1600, the counter controller 1620, and the buffer 1700 to control their operations. Here, the control register block 1800 may be operated according to control by the camera control 2100. The timing signal generator 1600 may be alternatively or additionally be referred to as a clock signal generator 1600.

The counter controller 1620 may receive a control signal from the control register block 1800 and may transmit counter control signals to a plurality of counters 1430 included in the analog-to-digital converter 1400 to control the operation of the counters 1430. The counter control signals may include a code generating clock signal for control generation of count codes of the count code generator, a counter reset signal for controlling reset operations of the counters 1430, and an inverting signal for inverting inner bits of the counters 1430. The counter controller 1620 may receive clock signals from the timing signal generator 1600 and may supply count enable clock signals and latch enable clock signals to the counters 1430.

The row driver 1200 may drive the pixel array 1100 for each row. For example, the row driver 1200 may generate a row selecting signal. The pixel array 1100 may output reset signals and/or video signals to the analog circuit 1300 from the row selected by the row selecting signal provided by the row driver 1200. The analog circuit 1300 may perform a correlated double sampling (CDS) operation to the received reset signals and the video signals.

The analog-to-digital converter 1400 may compare a reference signal Ramp provided by the reference signal generator 1610 and pixel signals transmitted from column lines of the pixel array 1110 to generate comparison result signals, may count the comparison result signals, and may output the counted signals to the buffer 1700. In various example embodiments, the analog-to-digital converter 1400 may perform a correlated double sampling operation on the pixel signals.

The buffer 1700 may store, e.g. may temporarily store, digital signals output by the analog-to-digital converter 1400 and may output the digital signals to the image processor 2000.

The analog-to-digital converter 1400 may include a plurality of comparators 1410 and a plurality of counters 1430.

The respective comparators 1410 may be connected to the column line of the pixel array 1110 and the reference signal generator 1610. In this instance, the column line of the pixel array 1110 may be connected to a first input terminal of the comparator 1410, and the reference signal generator 1610 may be connected to a second input terminal of the comparator 1410.

The comparator 1410 may receive a pixel signal that corresponds to an output signal of the column line and a reference signal generated by the reference signal generator 1610, may compare the output signal with or to the reference signal, and may output a comparison result signal to an output terminal. Here, the comparison result signal output by the comparator 1410 may correspond to a difference value between the video signal variable by illuminance of external light and the reset signal, and the reference signal is used to output the difference between the video signal and the reset signal so the difference may be picked up and may be output according to a slope of a ramp signal. The reference signal generator 1610 may be operated based on the control signal generated by the timing signal generator 1600.

Figure 3:
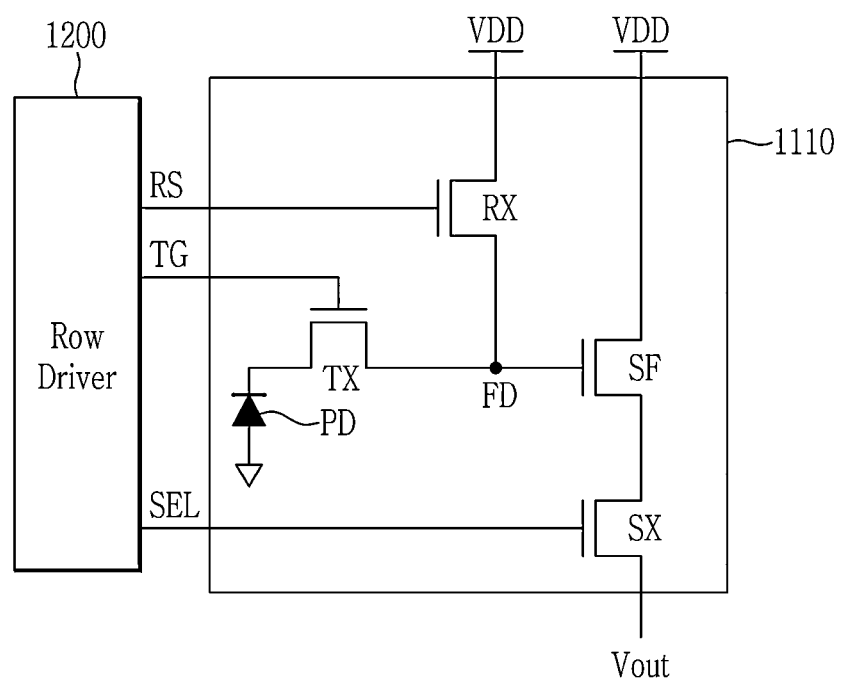
FIG. 3 shows a pixel shown in FIG. 2.

FIG. 3 shows an example of a pixel shown in FIG. 1 according to various example embodiments.

Referring to FIG. 3, the pixel 1110 may include a photodiode PD, a transmission transistor TX, a reset transistor RX, a source follower SF, and a selection transistor SX.

A first end of the transmission transistor TX is connected to the photodiode PD, a second end of the transmission transistor TX is connected to a floating diffusion region FD, and the control electrode (e.g. a gate electrode of the transmission transistor TX) receives a control signal TG.

A first end of the reset transistor RX receives a power source voltage VDD, a second end of the reset transistor RX is connected to the floating diffusion region FD, and the control electrode (e.g. a gate electrode of the reset transistor RX) receives a control signal RS. A first end of the source follower SF receives the power source voltage VDD, a second end of the source follower SF is connected to a first end of the selection transistor SX, and the control electrode (e.g. a gate electrode of the source follower SX) is connected to the floating diffusion region FD. A second end of the selection transistor SX is connected to the column line CL, and the control electrode (e.g. a gate electrode of the selection transistor) receives a control signal SEL.

The respective control signals TG, RS, and SEL for controlling the respective transistors TX, RX, and SX may be output by the row driver 1200. An output signal Vout of the selection transistor SX is supplied to the column line.

FIG. 3 shows one photodiode PD and one transmission transistor TX for better understanding and ease of description, and the pixel 1110 may be realized to have various different structures and/or shapes such as the pixel on which the floating diffusion region FD is shared, according to a detailed realization object. Alternatively or additionally electrical properties and/or geometric properties of each of the transistors TX, RX, SF, SX may be the same, or may be different from one another; example embodiments are not limited thereto.

Figure 4:
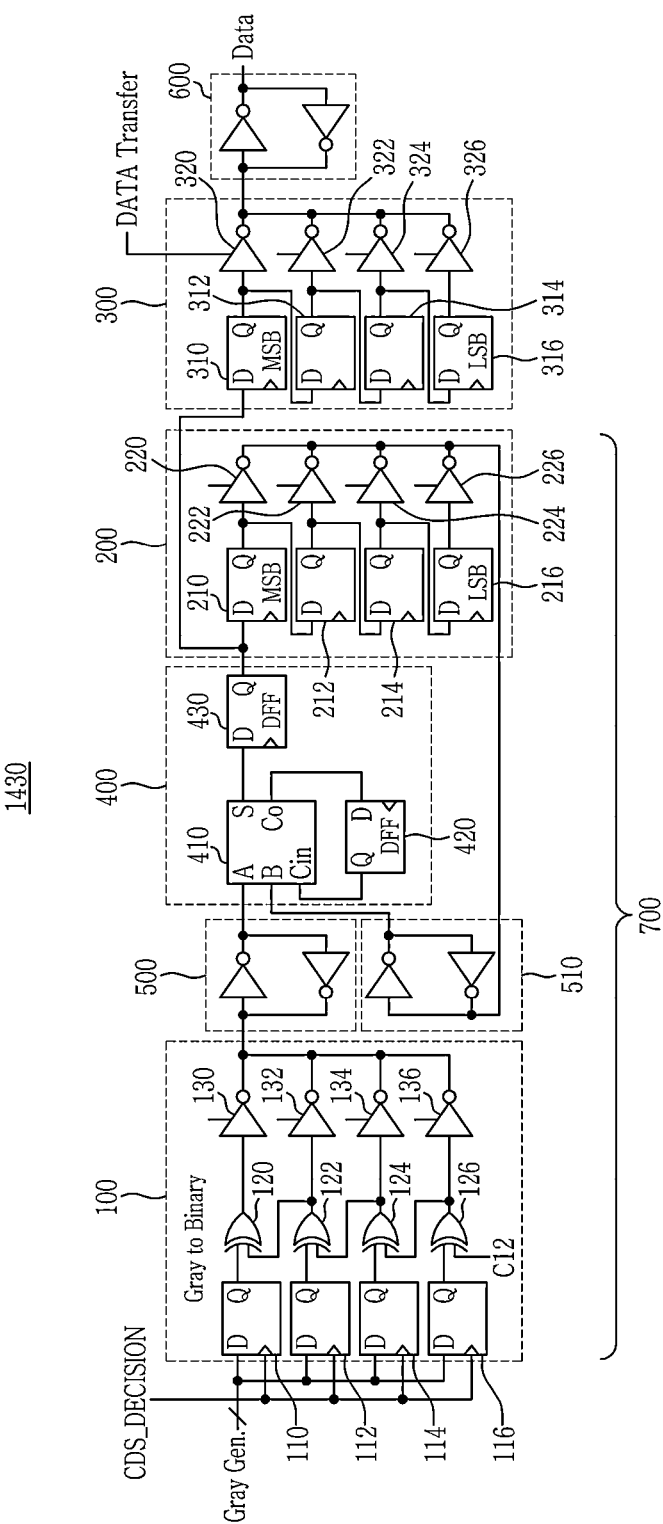
FIG. 4 and FIG. 5 show a semiconductor device according to various example embodiments.
Figure 5:
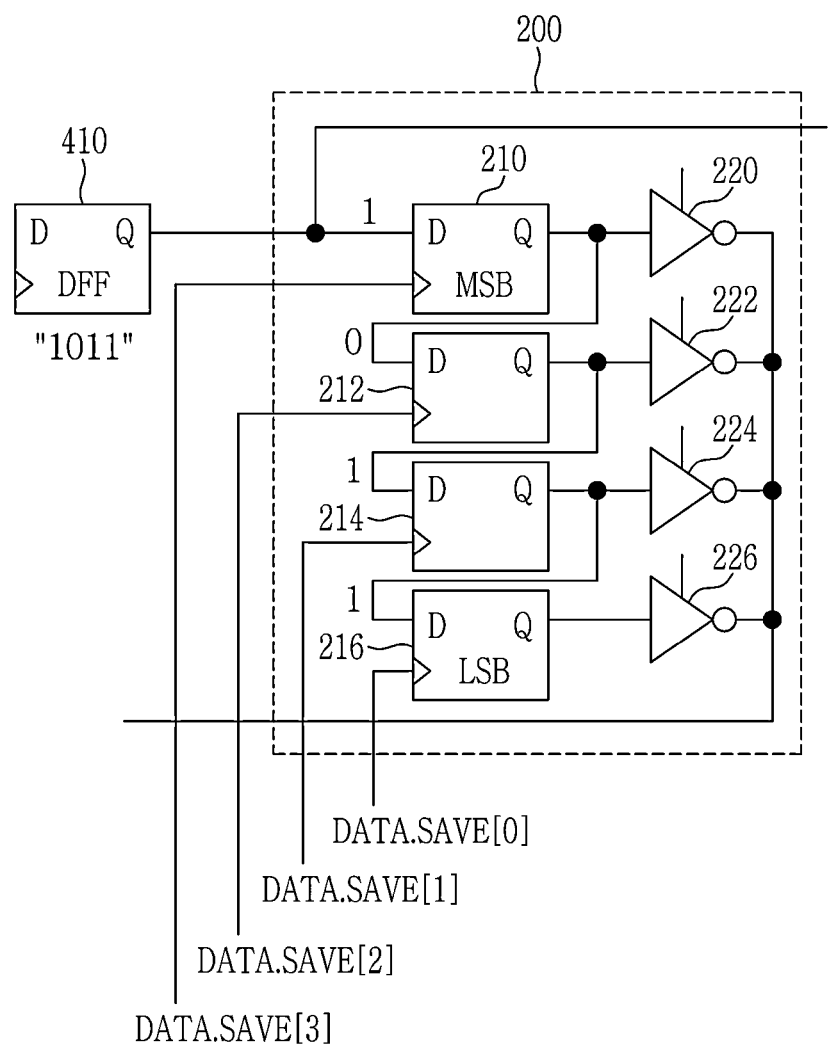

FIG. 4 and FIG. 5 show a semiconductor device according to various example embodiments.

Referring to FIG. 4, the semiconductor device may include a first counter latch circuit 100, a second counter latch circuit 200, a data latch circuit 300, an operation circuit 400, and back-to-back inverters 500, 510, and 600. The circuit 700 including the first counter latch circuit 100, the second counter latch circuit 200, the operation circuit 400, and the back-to-back inverters 500 and 510 may be positioned in the column C shown in FIG. 1.

The first counter latch circuit 100 may receive a count code, and may latch the count code according to the comparison result signal CDS_DECISION. As described above, the comparison result signal CDS_DECISION is output by comparing the pixel signal and or with the reference signal, and the count code may be latched to the first counter latch circuit 100 according to a level of the comparison result signal CDS_DECISION.

The first counter latch circuit 100 may include a plurality of first latches 110, 112, 114, and 116, logical operators 120, 122, 124, and 126, and first output buffers 130, 132, 134, and 136. Although the first latches 110, 112, 114, and 116 are illustrated as D-type flip flops, example embodiments are not limited thereto. Although the logical operators 120, 122, 124, and 126 are illustrated as XOR gates, example embodiments are not limited thereto. Although the first output buffers 130, 132, 134, and 136 are illustrated as tri-state inverters, example embodiments are not limited thereto. Still further the number of first latches 110, 112, 114, and 116, the number of logical operators 120, 122, 124, and 126, and the number of first output buffers 130, 132, 134, and 136 are not limited to those illustrated in the figure, and/or may or may not be the same as each other.

The first latches 110, 112, 114, and 116 may latch the count code. In detail, the first latches 110, 112, 114, and 116 may receive a gray code generated by the gray code generator "Gray Gen." through the input signal port D for each 1 bit. The first latches 110, 112, 114, and 116 may latch the received gray code according to the comparison result signal CDS_DECISION applied to a clock port, and/or may transmit the gray code to the logical operators 120, 122, 124, and 126 through an output signal port Q.

The logical operators 120, 122, 124, and 126 may convert the gray codes transmitted from a plurality of first latches 110, 112, 114, and 116 into binary codes, and may store conversion results in the first output buffers 130, 132, 134, and 136. For this purpose, the logical operators 120, 122, 124, and 126 may include a plurality of logic gates (e.g., a plurality of XOR gates). In detail, one of inputs of the logic gate 120 may be connected to an output signal port Q of the first latch 110, and the other thereof may be connected to an output of an adjacent logic gate 122. This configuration may be applied to the case of the logic gates 122 and 124. One of inputs of the logic gate 126 may be connected to an output signal port Q of the first latch 114, and a code determining signal C12 may be applied to the other thereof.

The code determining signal C12 may determine a code of the count code output to the operation circuit 400 from the first counter latch circuit 100. In detail, when the code determining signal C12 is set to be a first logic value (e.g., logic high or a '1'), the output count code may be a negative value. Differing from this, when the code determining signal C12 is set to be a second logic value (e.g., logic low or a '0') which is different from the first logic value, the output count code may be a positive value. By adjusting the code of the value input to the operation circuit 400 for performing a sum operation by using the code determining signal C12, the operation circuit 400 may be controlled to perform a difference operation. For example, when a reset component data RST is stored, the code determining signal C12 may be set to be a first logic value, and the image component data SIG may be stored. When the reset component data RST and the image component data SIG are added, the code determining signal C12 is set to be a second logic value to resultantly realize the difference operation.

The first output buffers 130, 132, 134, and 136 may receive binary codes transmitted from the logical operators 120, 122, 124, and 126 and may store the same. For this purpose, the first output buffers 130, 132, 134, and 136 may be or may include a plurality of 3-phase or tri-state inverters. The respective tri-state inverters may store values according to the control signal provided by an external device or may output the stored values, and for this operation, the respective tri-state inverters may include a control signal receiving port. For example, a control signal provided by the timing signal generator 1600 shown in FIG. 1 and FIG. 2 may be supplied to the control signal receiving port.

The binary codes stored in the first output buffers 130, 132, 134, and 136 may be output bit by bit to the operation circuit 400 according to the control signal input to the control signal terminals of the first output buffers 130, 132, 134, and 136.

The back-to-back or cross-coupled inverters 500 may perform a function of maintaining the data when the outputs of the first output buffers 130, 132, 134, and 136 are in a floating state.

The operation circuit 400 may include an operation unit 410 and flipflops 420 and 430. The operation unit 410 may operate to determine a sum of the values transmitted to the ports A and B and may output the sum to a port S. The operation circuit 400 may be or may include a serial adder, and so as to perform a serial addition, the flipflop 420 may store a carry received from a port Co, and may transmit the carry to the operation unit 410 through a port Cin. The flipflop 430 may receive an operation result from the port S.

The back-to-back or cross-coupled inverters 510 may perform a function of maintaining corresponding data before transmitting the count code on the reset component data RST latched to the second counter latch circuit 200 to the port B of the operation unit 410.

The second counter latch circuit 200 may include a plurality of second latches 210, 212, 214, and 216 and second output buffers 220, 222, 224, and 226. Furthermore a number of second latches 210, 212, 214, and 216 may be the same as, or different from, a number of first latches 110, 112, 114, and 116, and/or may be the same as=, or different from, a number of second output buffers 220, 222, 224, and 226. The plurality of second latches 210, 212, 214, and 216 may be or may include flip-flops such as D-type flip-flops; however, example embodiments are not limited thereto.

The second latches 210, 212, 214, and 216 may receive the count code on the reset component data RST provided by the first counter latch circuit 100 and may latch the count code.

The second latches 210, 212, 214, and 216 may be coupled in series to each other. The values transmitted to the second latches 210, 212, 214, and 216 may sequentially bypass through the second latches 210, 212, 214, and 216 connected in series. For example, a first data bit transmitted to the second latch 210 may be transmitted to the second latch 216 through the second latch 212 and the second latch 214. A second data bit transmitted to the second latch 210 may be transmitted to the second latch 214 through the second latch 212.

In detail, the second latches 210, 212, 214, and 216 coupled in series may include a first front latch 210 and a first rear latch 212. An output signal port Q of the first front latch 210 may be directly connected to an input signal port D of the first rear latch 212 through a signal line. Alternatively or additionally, the second latches 210, 212, 214, and 216 coupled in series may include a second front latch 212 and a second rear latch 214. An output signal port Q of the second front latch 212 may be directly connected to an input signal port D of the second rear latch 214 through a signal line.

The count codes may be transmitted to the second latches 210, 212, 214, and 216 in order from a least significant bit LSB to a most significant bit MSB. The least significant bit may be transmitted to the second latch 216 through the second latch 210, the second latch 212, and the second latch 214, and the most significant bit may be latched to the second latch 210.

The above-noted operation may be performed according to a data storing signal DATA.SAVE[ ] applied to clock ports of the second latches 210, 212, 214, and 216. In detail, when a data storing signal DATA.SAVE[0] applied to the clock port of the second latch 216 is set to be a first logic value (e.g., logic high or '1'), the second latch 216 may latch the least significant bit of the count code input to the second counter latch circuit 200. When a data storing signal DATA.SAVE[1] applied to the clock port of the second latch 214 is set to be the first logic value (e.g., logic high or '0'), the second latch 214 may latch a next high-order bit of the bit latched to the second latch 216 from among the count codes input to the second counter latch circuit 200. When a data storing signal DATA.SAVE[2] applied to the clock port of the second latch 212 is set to be the first logic value (e.g., logic high or '1'), the second latch 212 may latch a next high-order bit of the bit latched to the second latch 214 from among the count codes input to the second counter latch circuit 200. When a data storing signal DATA.SAVE[3] applied to the clock port of the second latch 210 is set to be the first logic value (e.g., logic high or '0'), the second latch 210 may latch the most significant bit of the count code input to the second counter latch circuit 200.

The second output buffers 220, 222, 224, and 226 may receive values transmitted from the second latches 210, 212, 214, and 216, and may store the values. For this purpose, the second output buffers 220, 222, 224, and 226 may be or may include a plurality of tri-state inverters. The respective tri-state inverters may store values or may output the stored values according to the control signal provided from the outside, and for this operation, the respective tri-state inverters may have control signal receiving ports. For example, the control signal provided by the timing signal generator 1600 shown in FIG. 1 and FIG. 2 may be provided to the control signal receiving port. The count codes stored in the second output buffers 220, 222, 224, and 226 may be transmitted to the operation circuit 400 through the back-to-back inverter 510 according to the control signal.

Referring to FIG. 5, when the count code "1011" is provided to the second counter latch circuit 200, the count code is transmitted in an order from the least significant bit to the most significant bit so the least significant bit '1' may be latched to the second latch 216, the next high-order bit '1' of the bit stored in the second latch 216 may be latched to the second latch 214, the next high-order bit '0' of the bit stored in the second latch 214 may be latched to the second latch 212, and the most significant bit '1' may be latched to the second latch 210.

The data latch circuit 300 may include a plurality of third latches 310, 312, 314, and 316 and third output buffer 320, 322, 324, and 326; a number of third latches 310, 312, 314, and 316 and/or a number of third output buffers 320, 322, 324, and 326 are not limited thereto.

The third latches 310, 312, 314, and 316 may receive the count code that corresponds to the sum operation result of the reset component data RST and the image component data SIG from the operation circuit 400 and may latch the same.

The third latches 310, 312, 314, and 316 may be coupled in series to each other. Hence, the values transmitted to the third latches 310, 312, 314, and 316 may sequentially bypass through the third latches 310, 312, 314, and 316 connected in series. For example, the first data bit transmitted to the third latch 310 may be transmitted to the third latch 316 through the third latch 312 and the third latch 314. The second data bit transmitted to the third latch 310 may be transmitted to the second latch 314 through the third latch 312.

In detail, the third latches 310, 312, 314, and 316 coupled in series may include a third front latch 310 and a third rear latch 312. An output signal port Q of the third front latch 310 may be directly connected to an input signal port D of the third rear latch 312 through a signal line. Alternatively or additionally, the third latches 310, 312, 314, and 316 coupled in series may include a fourth front latch 312 and a fourth rear latch 314. An output signal port Q of the fourth front latch 312 may be directly connected to an input signal port D of the fourth rear latch 414 through a signal line.

The count codes may be transmitted to the third latches 310, 312, 314, and 316 in order from the least significant bit LSB to the most significant bit MSB. Hence, the least significant bit may be transmitted to the third latch 316 through the third latch 310, the third latch 312, and the third latch 314, and the most significant bit may be latched to the third latch 310.

The above-noted operation may be performed according to the data storing signal DATA.SAVE[ ] applied to clock ports of the third latches 310, 312, 314, and 316. In detail, when the data storing signal DATA.SAVE[0] applied to a clock port of the third latch 316 is set to be the first logic value (e.g., logic high or '1'), the third latch 316 may latch the least significant bit of the count code input to the data latch circuit 300. When the data storing signal DATA.SAVE [1] applied to a clock port of the third latch 314 is set to be the first logic value (e.g., logic high or '1'), the third latch 314 may latch the next high-order bit of the bit latched to the third latch 316 from among the count code input to the data latch circuit 300. When the data storing signal DATA.SAVE [2] applied to a clock port of the third latch 312 is set to be the first logic value (e.g., logic high or '1'), the third latch 312 may latch the next high-order bit of the bit latched to the third latch 314 from among the count code input to the data latch circuit 300. When the data storing signal DATA.SAVE [3] applied to a clock port of the third latch 310 is set to be the first logic value (e.g., logic high or '1'), the third latch 310 may latch the most significant bit of the count code input to the data latch circuit 300.

The third output buffer 320, 322, 324, and 326 may receive the values transmitted from the third latch 310, 312, 314, and 316, and may store them. To achieve this, the third output buffer 320, 322, 324, and 326 may include a plurality of tri-state inverters. The respective tri-state inverters may store values according to a control signal DATA Transfer provided by an external device or may output the stored values, and for this operation, the respective tri-state inverters may include a control signal receiving port. For example, the control signal DATA Transfer provided by the timing signal generator 1600 shown in FIG. 1 and FIG. 2 may be provided to the control signal receiving port. The count codes stored in the third output buffer 320, 322, 324, and 326 may be output to the outside through the back-to-back inverter 600 according to the control signal.

According to various example embodiments, as the second latches 210, 212, 214, and 216 and the third latches 310, 312, 314, and 316 are realized to be connected in series to each other, there is no need or desire or expectation to form a metal line for connecting the input signal ports D for a plurality of latches. Therefore, a time delay generated by the long metal line may be prevented or reduced in likelihood and/or in impact, to thus allow high-rate operations, and as the number of elements formed in the column region is increased according to the simplified layout, there is no need or desire or expectation to obtain the long metal line when pitches obtainable between the elements are restricted, thereby achieving an improved space efficiency and/or increasing compactness. Alternatively or additionally, the number of loads at the output terminal of the operation circuit 400 may be reduced to 2 from 2n, and one vertical line may be reduced per column, thereby reducing a metal stack (e.g. a height of the metal stack).

Figure 6:
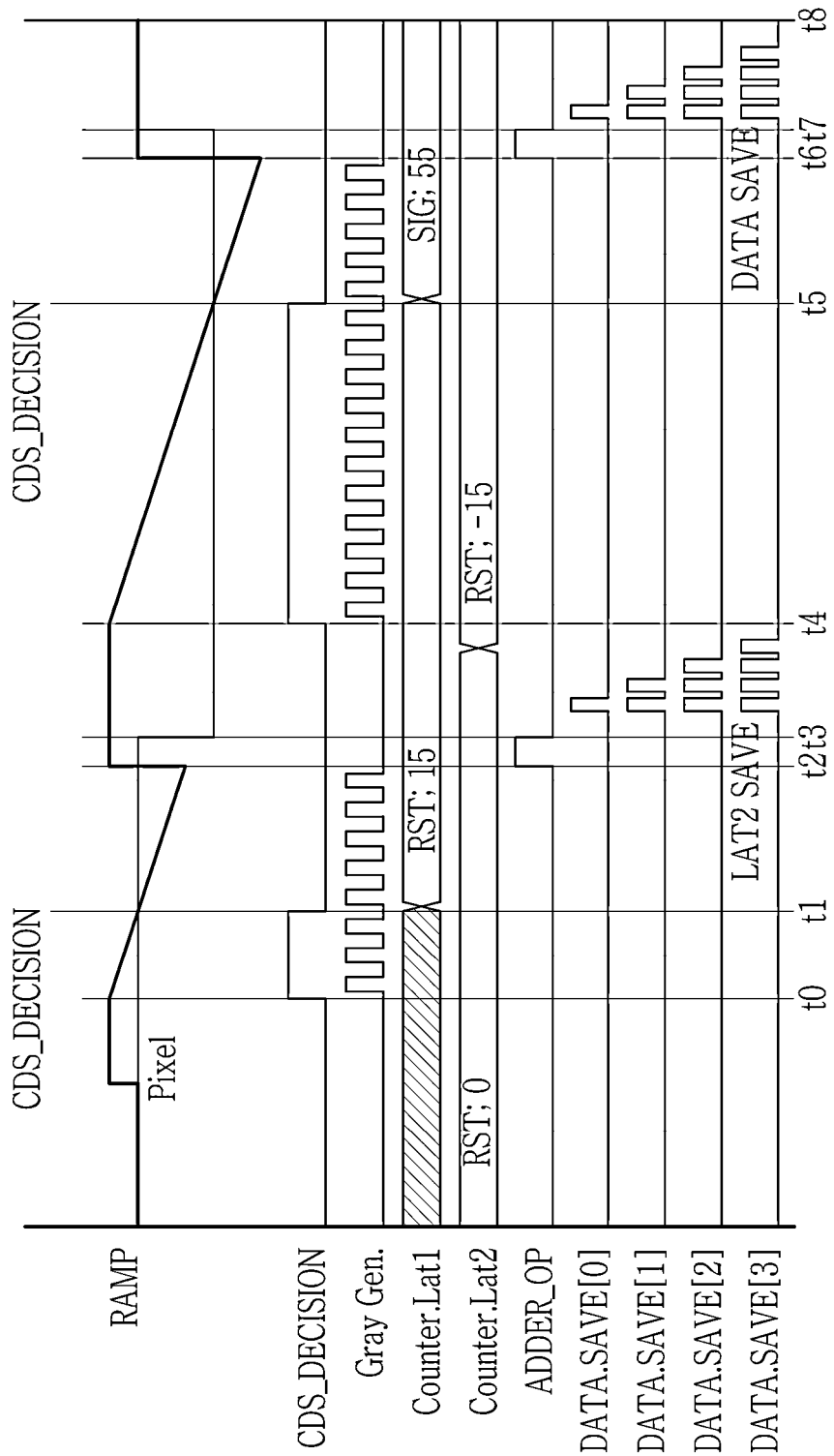
FIG. 6 and FIG. 7 show an operation of a semiconductor device according to various example embodiments.
Figure 7:
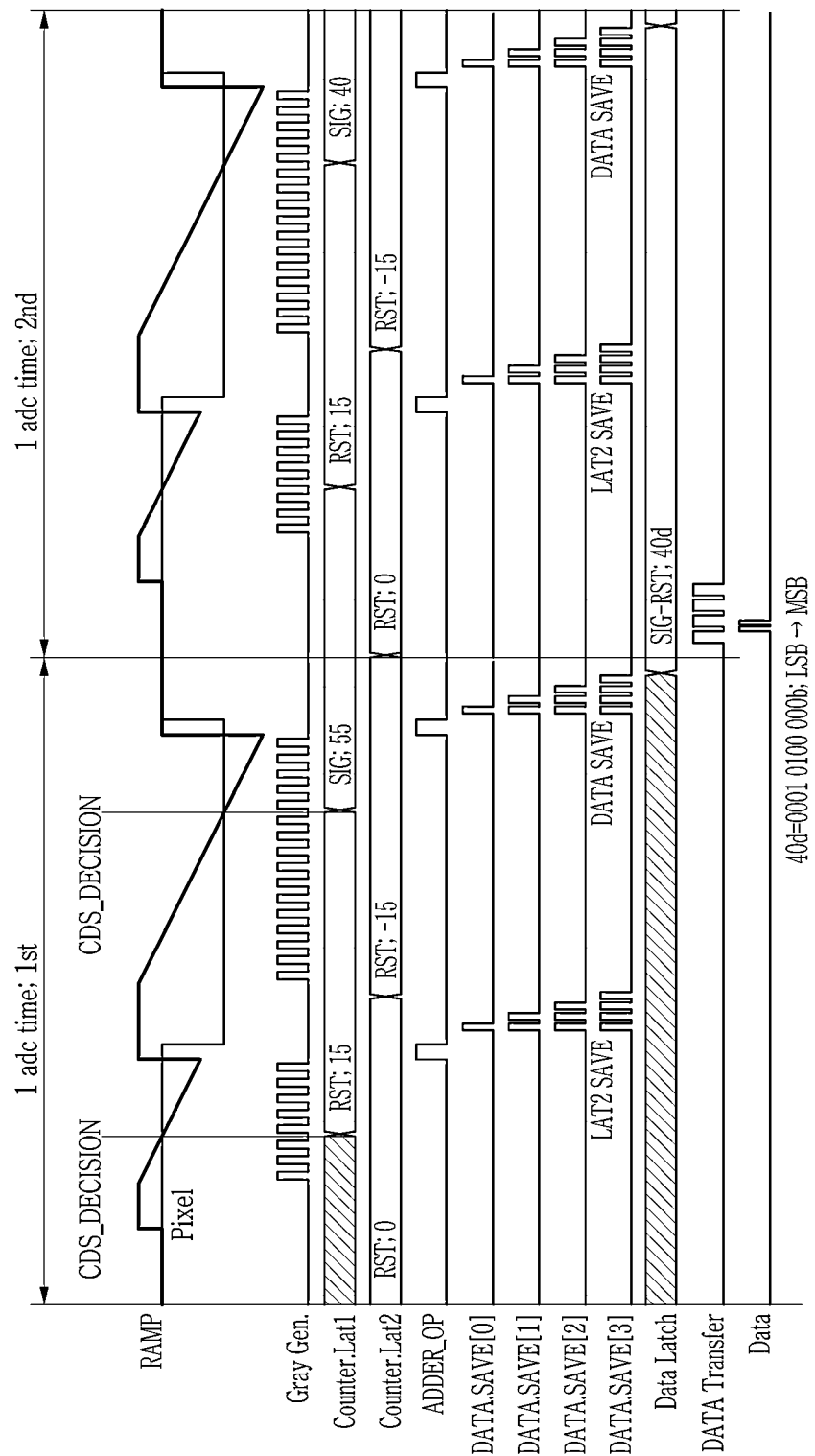

FIG. 6 and FIG. 7 show an operation of a semiconductor device according to various example embodiments.

Referring to FIG. 6, at time t0 when the reference signal falls for the first time, a gray code is generated by a gray code generator "Gray Gen.", and a comparison result signal CDS_DECISION may be output. At time t1, the first counter latch circuit 100 "Counter.Lat1" may latch the reset component data RST according to a transition of the comparison result signal CDS_DECISION.

At time t2, the count code converted and output into a binary code by the first counter latch circuit 100 may be transmitted to the operation circuit 400, and at time t3, the count code output by the operation circuit 400 may be transmitted to the second counter latch circuit 200. The operation of the operation circuit 400 may follow an operation circuit operating signal ADDER_OP, and for example, the operation circuit operating signal ADDER_OP may be provided by the timing signal generator 1600 shown in FIG. 1 and FIG. 2.

For a section of the time t3 to the time t4, the second counter latch circuit 200 may latch the reset component data RST by using the second latches 210, 212, 214, and 216 coupled in series. In detail, when the data storing signal DATA.SAVE[0] applied to the clock port of the second latch 216 is set to be the first logic value (e.g., logic high), the second latch 216 may latch the least significant bit of the count code input to the second counter latch circuit 200. When the data storing signal DATA.SAVE[1] applied to the clock port of the second latch 214 is set to be the first logic value (e.g., logic high or '1'), the second latch 214 may latch the next high-order bit of the bit latched to the second latch 216 from among the count code input to the second counter latch circuit 200. When the data storing signal DATA.SAVE [2] applied to the clock port of the second latch 212 is set to be the first logic value (e.g., logic high or '1'), the second latch 212 may latch the next high-order bit of the bit latched to the second latch 214 from among the count code input to the second counter latch circuit 200. When the data storing signal DATA.SAVE[3] applied to the clock port of the second latch 210 is set to be the first logic value (e.g., logic high or '1'), the second latch 210 may latch the most significant bit of the count code input to the second counter latch circuit 200.

At time t4 when the reference signal falls for the second time, the gray code is generated, and the comparison result signal CDS_DECISION may be output. At the time t5, the first counter latch circuit 100 may latch the image component data SIG according to the comparison result signal CDS_DECISION.

At time t6, the image component data SIG converted and output into the binary code by the first counter latch circuit 100 may be transmitted to the operation circuit 400, and the reset component data RST provided by the second counter latch circuit 200 may be transmitted to the operation circuit 400. The operation circuit 400 may output valid image data that is a subtraction of the reset component data RST from the image component data SIG. At the time t7, the valid image data output by the operation circuit 400 may be transmitted to the data latch circuit 300. The operation of the operation circuit 400 may follow the operation circuit operating signal ADDER_OP, and for example, the operation circuit operating signal ADDER_OP may be provided by the timing signal generator 1600 shown in FIG. 1 and FIG. 2.

For a section of the time t7 to the time t8, the third counter latch circuit 200 may latch the valid image data by using the third latches 310, 312, 314, and 316 coupled in series. In detail, when the data storing signal DATA.SAVE[0] applied to the clock port of the third latch 316 is set to be the first logic value (e.g., logic high or '2'), the third latch 316 may latch the least significant bit of the count code input to the data latch circuit 300. When the data storing signal DATA.SAVE[1] applied to the clock port of the third latch 314 is set to be the first logic value (e.g., logic high or '1'), the third latch 314 may latch the next high-order bit of the bit latched to the third latch 316 from among the count code input to the data latch circuit 300. When the data storing signal DATA.SAVE[2] applied to the clock port of the third latch 312 is set to be the first logic value (e.g., logic high or '1'), the third latch 312 may latch the next high-order bit of the bit latched to the third latch 314 from among the count code input to the data latch circuit 300. When the data storing signal DATA.SAVE[3] applied to the clock port of the third latch 310 is set to be the first logic value (e.g., logic high or '1'), the third latch 310 may latch the most significant bit of the count code input to the data latch circuit 300.

FIG. 7 shows an operation that corresponds to two ADC times including a portion, shown in FIG. 6, showing an operation that corresponds to one ADC time.

Referring to FIG. 7, the valid image data latched to the data latch circuit 300 at the first ADC time from among two ADC times, for example, a subtraction of the reset component data RST from the image component data SIG, may be finally output as data "Data" according to the data transfer signal "DATA Transfer" at the second ADC time from among the two ADC times. The data transfer signal "DATA Transfer" may be applied to the control signal receiving ports of the third output buffers 320, 322, 324, and 326 and may perform the operation.

Detailed descriptions on FIG. 6 and FIG. 7 may refer to the content described with reference to FIG. 4 so no detailed description will be provided.

Figure 8:
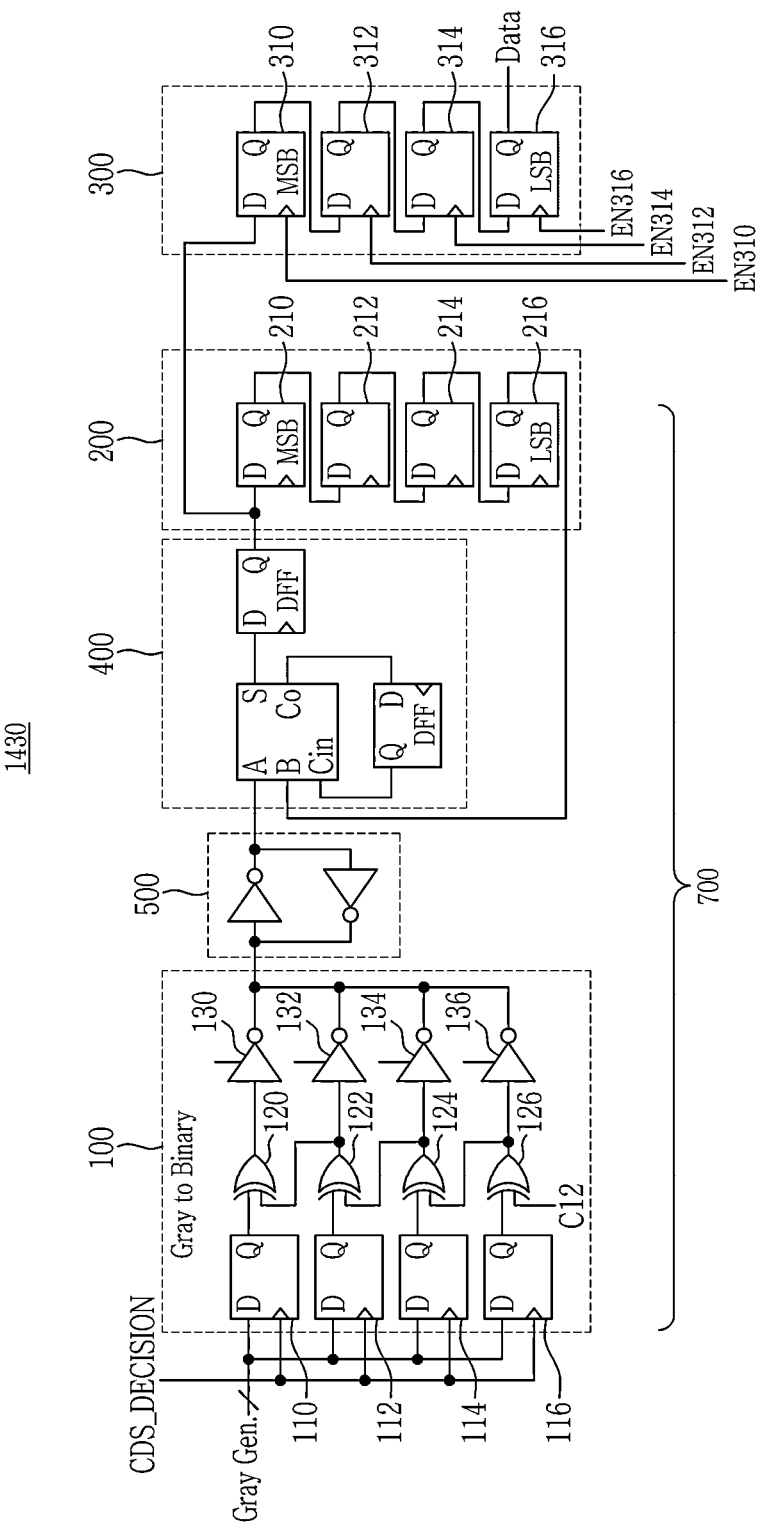
FIG. 8 shows a semiconductor device according to various example embodiments.

FIG. 8 shows a semiconductor device according to various example embodiments.

Referring to FIG. 8, the semiconductor device may include a first counter latch circuit 100, a second counter latch circuit 200, a data latch circuit 300, an operation circuit 400 and a back-to-back inverter 500. The circuit 700 including the first counter latch circuit 100, the second counter latch circuit 200, the operation circuit 400, and the back-to-back inverter 500 may be positioned in the column C shown in FIG. 1.

In various example embodiments described with reference to FIG. 4, the second counter latch circuit 200 and the data latch circuit 300 receive inputs in a serial way, and store and output signals in a parallel way, and in various example embodiments shown with reference to FIG. 8, the second counter latch circuit 200 and the data latch circuit 300 receive inputs in a serial way and store and output signals in a serial way. In various example embodiments, a detailed content on the first counter latch circuit 100, the operation circuit 400, and the back-to-back or cross-coupled inverter 500 pair may refer to the content described with reference to FIG. 4, and the second counter latch circuit 200 and data latch circuit 300 will now be described.

The second counter latch circuit 200 may include a plurality of second latches 210, 212, 214, and 216. The second latches 210, 212, 214, and 216 may receive the count code of the reset component data RST from the first counter latch circuit 100, may latch the same, or may transmit the same.

The second latches 210, 212, 214, and 216 may be coupled in series to each other. The values transmitted to the second latches 210, 212, 214, and 216, may sequentially bypass through the second latches 210, 212, 214, and 216 connected in series. For example, the first data bit transmitted to the second latch 210 may be transmitted to the second latch 216 through the second latch 212 and the second latch 214. The second data bit transmitted to the second latch 210 may be transmitted to the second latch 214 through the second latch 212. The count code may be transmitted in order from the least significant bit to the most significant bit to the second latches 210, 212, 214, and 216. Therefore, the least significant bit may be transmitted to the second latch 216 through the second latch 210, the second latch 212, and the second latch 214, and the most significant bit may be latched to the second latch 210. A detailed content of this operation may refer to the description on the second latches 210, 212, 214, and 216 of FIG. 4.

A difference between the second counter latch circuit 200 in various example embodiments described with reference to FIG. 4 and the second counter latch circuit 200 according to the present embodiment is that the inputs are received in a serial way and are then output in a serial way. In various example embodiments, the counter code may be latched according to the control signal applied to the clock ports of the second latches 210, 212, 214, and 216, and/or may be transmitted in a serial way among the second latches 210, 212, 214, and 216.

The data latch circuit 300 may include a plurality of third latches 310, 312, 314, and 316. The third latches 310, 312, 314, and 316 may receive the count code that corresponds to the sum operation result of the reset component data RST and the image component data SIG from the operation circuit 400, may latch the same, or may transmit the same.

The third latches 310, 312, 314, and 316 may be coupled in series to each other. Accordingly, the values transmitted to the third latches 310, 312, 314, and 316 may sequentially bypass through the third latches 310, 312, 314, and 316 connected in series. For example, the first data bit transmitted to the third latch 310 may be transmitted to the third latch 316 through the third latch 312 and the third latch 314. The second data bit transmitted to the third latch 310 may be transmitted to the second latch 314 through the third latch 312. The count code may be transmitted in order from the least significant bit LSB to the most significant bit MSB to the third latches 310, 312, 314, and 316. Hence, the least significant bit may be transmitted to the third latch 316 through the third latch 310, the third latch 312, and the third latch 314, and the most significant bit may be latched to the third latch 310. A detailed content on this operation may refer to the description on the third latches 210, 212, 214, and 216 of FIG. 4.

The difference between the data latch circuit 300 according to various example embodiments described with reference to FIG. 4 and the data latch circuit 300 according to various example embodiments is that the inputs are received in a serial way and are then output in a serial way. For example, in some example embodiments the counter code may be latched, or may be transmitted in a serial way among the third latches 310, 312, 314, and 316 according to the control signals EN310, EN312, EN313, and EN314 applied to the clock ports of the third latches 310, 312, 314, and 316. That is, the third latches 310, 312, 314, and 316 may function as a latch or a buffer according to the control signals EN310, EN312, EN313, and EN314, and a further detailed content thereof will now be described with reference to FIG. 9 to FIG. 11.

Figure 9:
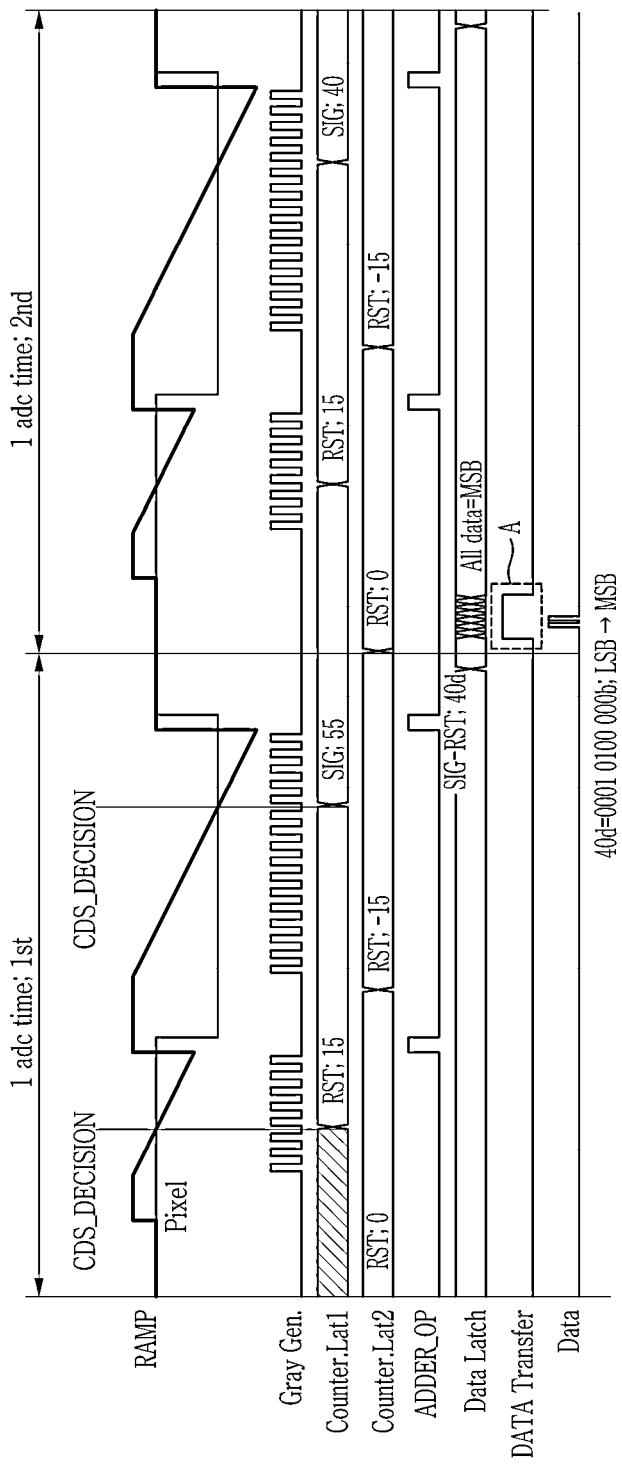
FIG. 9 and FIG. 10 show an operation of a semiconductor device according to various example embodiments.
Figure 10:
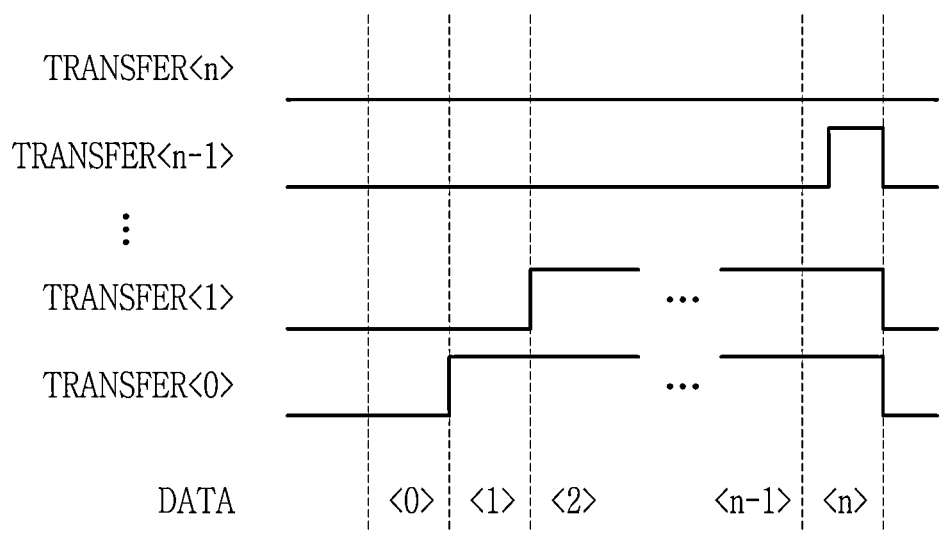
Figure 11:
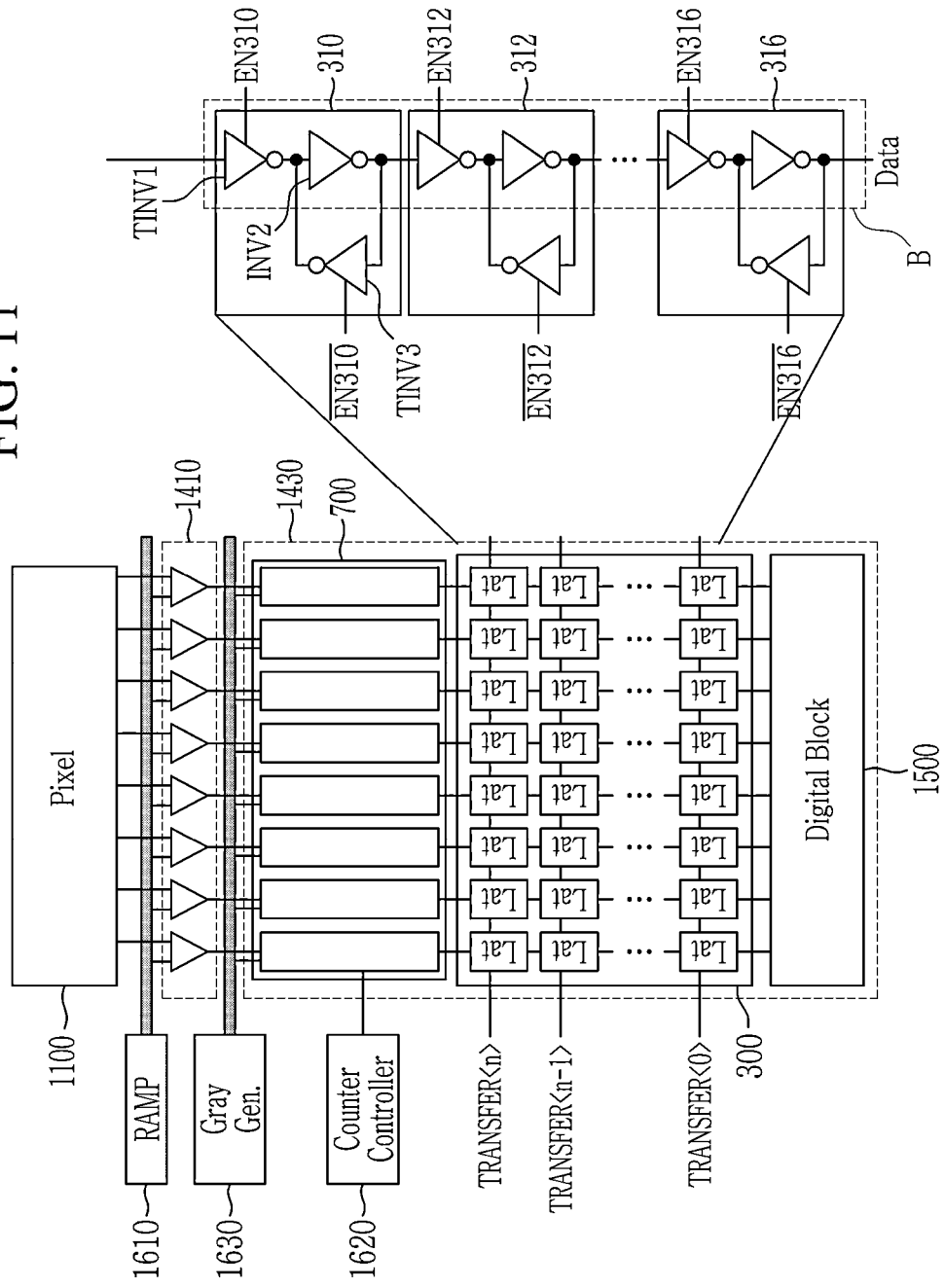
FIG. 11 shows a semiconductor device according to various example embodiments.

FIG. 9 and FIG. 10 show an operation of a semiconductor device according to various example embodiments, and FIG. 11 shows a semiconductor device according to various example embodiments.

Referring to FIG. 9, the descriptions on the comparison result signal CDS_DECISION, the first counter latch circuit 100 "Counter.Lat1", the second counter latch circuit 200 "Counter.Lat2", and the operation circuit operating signal ADDER_OP may refer to the content described with reference to FIG. 6, and no repeated descriptions will be provided.

The valid image data latched to the data latch circuit 300 at the first ADC time from among two ADC times, that is, a subtraction of the reset component data RST from the image component data SIG, may be finally output as data "Data" according to the data transfer signal "DATA Transfer" (marked as 'A') at the second ADC time from among the two ADC times.

Referring to FIG. 10, when the data transfer signal TRANSFER<0> applied to the third latch 316 as the control signal is set to be the first logic value (e.g., logic high or '1'), the third latch 316 functions as the buffer and the output of the third latch 314 may be transmitted to the data port. When the data transfer signal TRANSFER<1> applied to the third latch 314 as the control signal and the data transfer signal TRANSFER<0> applied to the third latch 316 as the control signal are set to be the first logic value (e.g., logic high or '1'), the third latches 314 and 316 may function as buffers and the output of the third latch 312 may be transmitted to the data port. When the data transfer signal TRANSFER<2> applied to the third latch 312 as the control signal, the data transfer signal TRANSFER<1> applied to the third latch 314 as the control signal, and the data transfer signal TRANSFER<0> applied to the third latch 316 as the control signal are set to be the first logic value (e.g., logic high or '1'), the third latches 312, 314, and 316 may function as buffers and the outputs of the third latch 310 may be transmitted to the data port.

Referring to FIG. 11, regarding the semiconductor device according to various example embodiments, the third latch 310 may be realized to include two tri-state inverters TINV1 and TINV3 and an inverter INV2, and the third latches 312 to 316 may have the same configuration. The control signal EN310 applied to the tri-state inverter TINV1 and the control signal EN310' applied to the tri-state inverter TINV3 may have an inverted signal relationship with each other. The control signals EN310 and EN310' may be applied to the clock ports of the third latches 310, 312, 314, and 316, and the third latches 310, 312, 314, and 316 may function as latches or buffers according to the values of the control signals EN310 to E316 and EN310' to E316'.

A portion marked as B in FIG. 11 shows that some of the tri-state inverters are operated in series and function as buffers according to the control signals EN310 to E316 and EN310' to E316'.

According to various example embodiments, the latch may be controlled according to the control signal to allow the same to function as a latch or a buffer, and the latch installed in the counter latch circuit or the data latch circuit may be used as a buffer if needed or desired.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been described in connection with what is considered to be various example embodiments, it is to be understood that inventive concepts are not limited to variously described example embodiments, but, on the contrary, is intended to cover various modifications and equivalent arrangements included within the spirit and scope of the appended claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. A semiconductor device comprising:
a first counter latch circuit configured to receive a count code and to latch the count code according to a comparison result signal; and
a second counter latch circuit configured to receive the count code from the first counter latch circuit, and to latch the count code by using a plurality of first latches,
wherein the plurality of first latches are coupled in series to each other and are configured to operate to sequentially bypass values transmitted to the respective plurality of first latches.

2. The semiconductor device of claim 1, wherein
the plurality of first latches coupled in series to each other include a first front latch and a first rear latch, and
an output signal port of the first front latch is directly connected to an input signal port of the first rear latch through a signal line.

3. The semiconductor device of claim 1, wherein
the semiconductor device is configured to operate such that the count code is transmitted to the first latches in an order from a least significant bit to a most significant bit.

4. The semiconductor device of claim 1, wherein
the second counter latch circuit includes a plurality of first tri-state inverters configured to selectively transmitting the count code output by the respective plurality of first latches to another circuit according to a control signal.

5. The semiconductor device of claim 1, further comprising:
a data latch circuit configured to receive a data code that corresponds to a result of performing an operation on a first count code latched to the first counter latch circuit and a second count code latched to the second counter latch circuit, and to latch the data code by using a plurality of second latches,
wherein the second latches are coupled in series to each other and are configured to operate to sequentially bypass values transmitted to the respective second latches.

6. The semiconductor device of claim 5, wherein
the second latches coupled in series to each other include a second front latch and a second rear latch, and
an output signal port of the second front latch is directly connected to an input signal port of the second rear latch through a signal line.

7. The semiconductor device of claim 5, wherein
the semiconductor device is configured to operate that the data code is transmitted to the second latches in an order from a least significant bit to a most significant bit.

8. The semiconductor device of claim 5, wherein
the data latch circuit includes a plurality of second tri-state inverters configured to selectively transmit the data code output by the respective second latches to another circuit according to a control signal.

9. The semiconductor device of claim 5, wherein
the first counter latch circuit is configured to latch image component data,
the second counter latch circuit is configured to latch reset component data by using the first latches, and
the data latch circuit is configured to receive valid image data that is a subtraction of the reset component data from the image component data as the data code.

10. The semiconductor device of claim 9, wherein
the data latch circuit is configured to latch the valid image data by using second latches.

11. A semiconductor device comprising:
a first counter latch circuit configured to receive a count code and to latch the count code according to a comparison result signal; and
a second counter latch circuit including a plurality of first latches coupled in series to each other and configured to operate according to an operation mode based on a first control signal, and to receive the count code from the first counter latch circuit,
wherein the first latches are configured to operate as latches in response to the first control signal being a first value, and the first latches are configured to operate as buffers in response to the first control signal being a second value that is different from the first value.

12. The semiconductor device of claim 11, wherein
the respective first latches include a plurality of tri-state inverters configured to be controlled according to the first control signal.

13. The semiconductor device of claim 11, wherein
the first latches coupled in series to each other include a first front latch and a first rear latch, and
an output signal port of the first front latch is directly connected to an input signal port of the first rear latch through a signal line.

14. The semiconductor device of claim 11, wherein
the semiconductor device is configured to operate such that the count code is transmitted to the first latches in an order from a least significant bit to a most significant bit.

15. The semiconductor device of claim 11, further comprising
a data latch circuit including a plurality of second latches coupled in series to each other and configured to operate according to an operation mode which is based on a second control signal, and to receive a data code that corresponds to a result of performing an operation on a first count code latched to the first counter latch circuit and a latched second count code provided by the second counter latch circuit,
wherein the second latches are configured to operate as latches in response to the second control signal being a third value, and the second latches are configured to operate as buffers in response to the second control signal being a fourth value that is different from the third value.

16. The semiconductor device of claim 15, wherein
the respective second latches include a plurality of tri-state inverters that are configured to be controlled according to the second control signal.

17. The semiconductor device of claim 15, wherein
the second latches coupled in series to each other include a second front latch and a second rear latch, and
an output signal port of the second front latch is directly connected to an input signal port of the second rear latch through a signal line.

18. The semiconductor device of claim 15, wherein
the semiconductor device is configured to operate such that the data code is transmitted to the second latches in an order from a least significant bit to a most significant bit.

19. The semiconductor device of claim 15, wherein
the first counter latch circuit is configured to latch image component data,
the second counter latch circuit is configured to latch reset component data by using the first latches, and
the data latch circuit is configured to receive valid image data that is a subtraction of the reset component data from the image component data as the data code.

20. The semiconductor device of claim 19, wherein
the data latch circuit is configured to latch the valid image data by using second latches.

* * * * *